US011391760B2

(12) United States Patent
Rondot et al.

(10) Patent No.: US 11,391,760 B2
(45) Date of Patent: Jul. 19, 2022

(54) CURRENT SENSOR AND MEASUREMENT SYSTEM INCLUDING SUCH A CURRENT SENSOR

(71) Applicant: Schneider Electric Industries SAS, Rueil Malmaison (FR)

(72) Inventors: Loïc Rondot, Gieres (FR); Lionel Urankar, Fontaine (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 3 days.

(21) Appl. No.: 16/879,210

(22) Filed: May 20, 2020

(65) Prior Publication Data

US 2020/0386793 A1 Dec. 10, 2020

(30) Foreign Application Priority Data

Jun. 7, 2019 (FR) ...................................... 1906095

(51) Int. Cl.
*G01R 15/18* (2006.01)
*G01R 19/00* (2006.01)
*H01F 5/02* (2006.01)
*H01F 27/32* (2006.01)

(52) U.S. Cl.
CPC ....... *G01R 15/181* (2013.01); *G01R 19/0092* (2013.01); *H01F 5/02* (2013.01); *H01F 27/32* (2013.01)

(58) Field of Classification Search
CPC .............. G01R 15/181; G01R 19/0092; G01R 15/183; H01F 5/02; H01F 27/32
USPC ...................................... 324/76.11, 126, 127
See application file for complete search history.

(56) References Cited

U.S. PATENT DOCUMENTS

| 4,059,798 | A | * | 11/1977 | Dierker | G01R 33/025 |
| | | | | | 324/225 |
| 4,857,874 | A | * | 8/1989 | Bessho | H01F 7/202 |
| | | | | | 335/296 |
| 4,975,637 | A | * | 12/1990 | Frankeny | G01R 1/07307 |
| | | | | | 324/72.5 |
| 5,199,178 | A | * | 4/1993 | Tong | G01C 17/30 |
| | | | | | 324/247 |
| 6,081,109 | A | * | 6/2000 | Seymour | G01R 15/183 |
| | | | | | 324/127 |
| 6,759,840 | B2 | * | 7/2004 | Marasch | G01R 15/247 |
| | | | | | 324/117 R |
| 7,450,053 | B2 | * | 11/2008 | Funk | E21B 29/06 |
| | | | | | 324/323 |
| 7,545,138 | B2 | * | 6/2009 | Wilkerson | G01R 15/181 |
| | | | | | 324/126 |
| 2003/0011458 | A1 | * | 1/2003 | Nuytkens | H01F 27/36 |
| | | | | | 336/200 |
| 2004/0257061 | A1 | * | 12/2004 | George de Buda | G01R 15/186 |
| | | | | | 324/117 R |

(Continued)

*Primary Examiner* — Tung X Nguyen
*Assistant Examiner* — Robert P Alejnikov, Jr.
(74) *Attorney, Agent, or Firm* — Locke Lord LLP

(57) ABSTRACT

A current sensor and measurement system including such a current sensor.
The current sensor includes:
 an insulating substrate provided with a central opening;
 a winding surrounding the central opening and including a coil wound around a portion of the insulating substrate;
wherein the current sensor includes at least one ferromagnetic layer incorporated within the portion of the insulating substrate, the coil surrounding the ferromagnetic layer.

14 Claims, 4 Drawing Sheets

(56) References Cited

U.S. PATENT DOCUMENTS

| | | | |
|---|---|---|---|
| 2007/0178727 A1* | 8/2007 | Igarashi | G01R 1/07314 |
| | | | 439/91 |
| 2009/0058398 A1* | 3/2009 | Ibuki | G01R 15/181 |
| | | | 324/126 |
| 2014/0049250 A1* | 2/2014 | Brown | H01F 38/30 |
| | | | 324/127 |
| 2014/0167786 A1* | 6/2014 | Gutierrez | G01R 15/181 |
| | | | 324/654 |
| 2014/0198463 A1* | 7/2014 | Klein | G01R 33/04 |
| | | | 361/748 |
| 2016/0111199 A1* | 4/2016 | Quilici | H01F 27/306 |
| | | | 336/200 |
| 2016/0268042 A1* | 9/2016 | Roth | G01R 15/183 |
| 2018/0052191 A1* | 2/2018 | Kern | G01R 15/181 |
| 2019/0154733 A1* | 5/2019 | Joo | G01R 15/18 |
| 2021/0065959 A1* | 3/2021 | Sturcken | H01F 10/06 |

\* cited by examiner

CURRENT SENSOR AND MEASUREMENT SYSTEM INCLUDING SUCH A CURRENT SENSOR

TECHNICAL FIELD

The present invention relates to a current sensor and to a measurement system including such a current sensor.

BACKGROUND

Rogowski windings are current sensors capable of measuring the intensity of an AC current flowing through an electrical conductor.

Such a sensor generally includes a wound coil which defines a closed contour around a central opening through which the electrical conductor is accepted. The current flowing through the electrical conductor induces a voltage across the terminals of the coil.

Rogowski windings may be manufactured on a printed circuit board (PCB). For example, an insulating substrate is pierced with a plurality of metallized through-holes arranged on the faces of the substrate in a predefined pattern and positioned so as to define a closed contour around a central opening. The succession of metallized holes and of electrically conductive tracks formed on layers of the substrate together define an electrically conductive path which forms a winding of the coil.

Printed circuit board Rogowski windings (PCB Rogowski coils) have the particular advantages of being relatively simple and inexpensive to manufacture on an industrial scale. They are also easy to miniaturize.

One drawback of these sensors is that their gain is low (for example about 10 μV per ampere), which makes it difficult to detect small variations in current in the electrical conductor. This limitation is unacceptable in certain applications, for example when such a sensor is used as a current sensor in an electrical protection device in an electricity distribution installation.

There is therefore a need for current sensors, in particular printed circuit board windings, which overcome these drawbacks.

SUMMARY

According to a first aspect of the invention, a current sensor includes:
  an insulating substrate provided with a central opening;
  a winding surrounding the central opening and including a coil wound around a portion of the insulating substrate;
wherein the current sensor includes at least one ferromagnetic layer incorporated within the portion of the insulating substrate, the coil surrounding the layer of ferromagnetic material.

According to some advantageous but non-mandatory aspects, such a current sensor may incorporate one or more of the following features, taken alone or in any technically admissible combination:
  The coil includes a plurality of coil portions that are electrically connected in series, the coil portions being rectilinear in shape and arranged so as to form a closed contour in the shape of a quadrilateral around the central opening.
  The ferromagnetic layer is common to all of the coil portions.
  The ferromagnetic layer is divided into several parts, each associated with one of the coil portions.
  The ferromagnetic layer includes a sublayer of an alloy of iron and of nickel and two sublayers of copper stacked on either side of the sublayer of iron and nickel alloy.
  The iron and nickel alloy is an FeNi36 alloy.
  The thickness of the ferromagnetic layer is greater than or equal to 150 μm.
  The winding further includes an additional coil wound around another portion of the substrate and offset in a direction perpendicular to the plane of the substrate, the two coils being interlaced and electrically connected in series, and wherein an additional ferromagnetic layer is incorporated within said other portion of the insulating substrate, the additional coil surrounding the additional ferromagnetic layer.
  The substrate includes a through-via perpendicular to the plane of the substrate, and in which the ferromagnetic layer is separated from said through-via by a buffer zone devoid of ferromagnetic material.
  The substrate is a printed circuit board including one or more stacked layers of a cured polymer material.

According to another aspect of the invention, a measurement system includes a current sensor such as described above and an electronic processing circuit that is configured to process the signal measured by the current sensor.

BRIEF DESCRIPTION OF THE DRAWINGS

The invention will be better understood and other advantages thereof will become more clearly apparent in the light of the following description of one embodiment of a current sensor, given solely by way of example and with reference to the appended drawings, in which.

DETAILED DESCRIPTION

Figure 1:
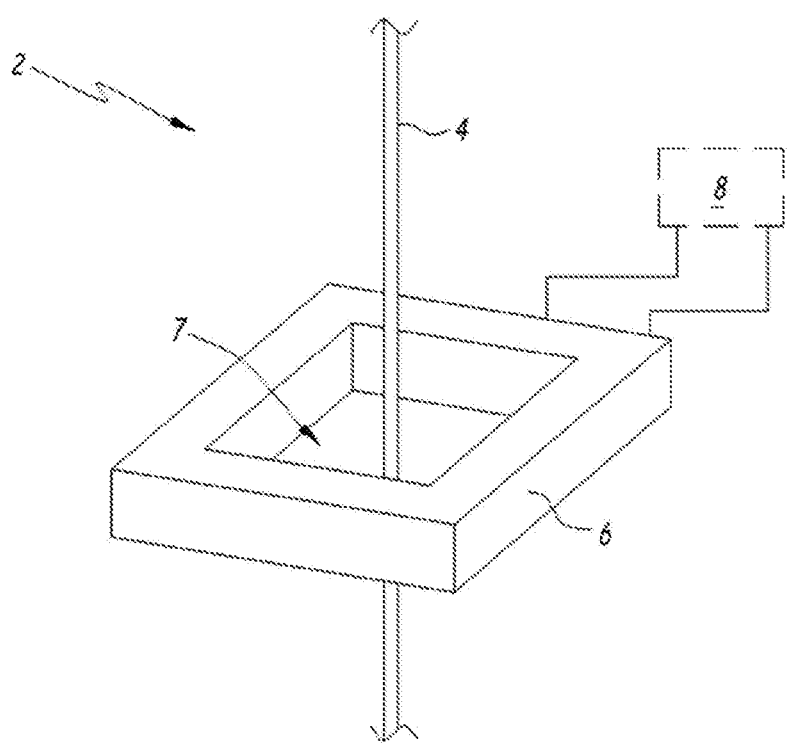
FIG. 1 is a schematic representation of a measurement system including a current sensor according to some embodiments of the invention.

FIG. 1 shows a measurement system 2 for measuring the intensity of an electric current flowing through an electrical conductor 4, such as a cable, a wire or a busbar.

The system 2 in this case includes a current sensor 6 and an electronic processing circuit 8 that is connected to the current sensor 6 and configured to process the signal measured by the current sensor 6.

According to some embodiments, the current sensor 6 includes a winding including a coil which defines a closed contour around a central opening 7 through which the conductor 4 is accepted. End terminals of the winding are connected to an input of the processing circuit 8.

For example, the closed contour takes the shape of a polygon, in particular a quadrilateral, such as a square. As a variant, other shapes may be envisaged, such as a circle or an ellipse.

According to some examples, the current flowing through the electrical conductor induces a voltage across the terminals of the coil. This voltage is proportional to the time derivative of the intensity of the current which flows through the conductor 4.

The processing circuit 8 is, for example, configured to calculate the value of the current on the basis of the voltage signal delivered as output from the current sensor 6.

According to some embodiments, the current sensor 6 and the processing circuit 8 may be mounted on one and the same printed circuit board.

Figure 2:
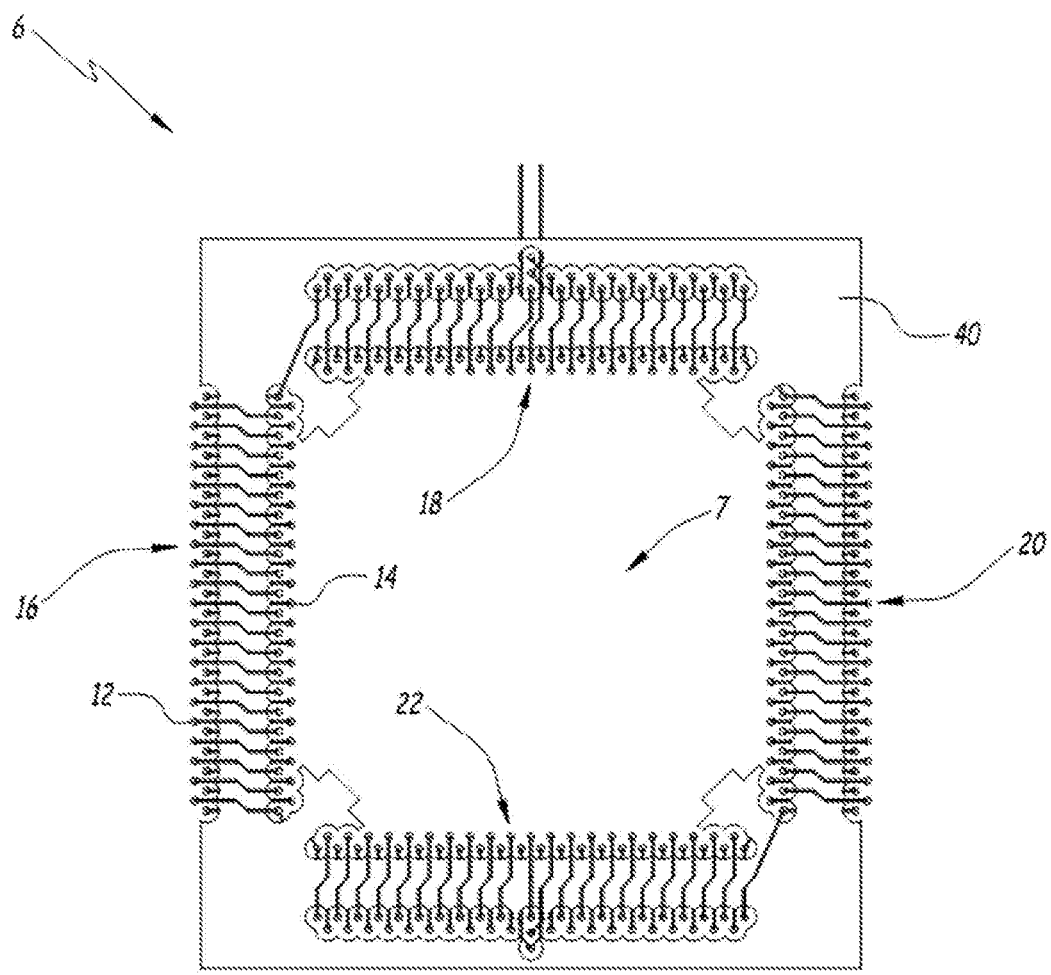
FIG. 2 is a schematic representation of a current sensor of a first embodiment of the invention.
Figure 3:
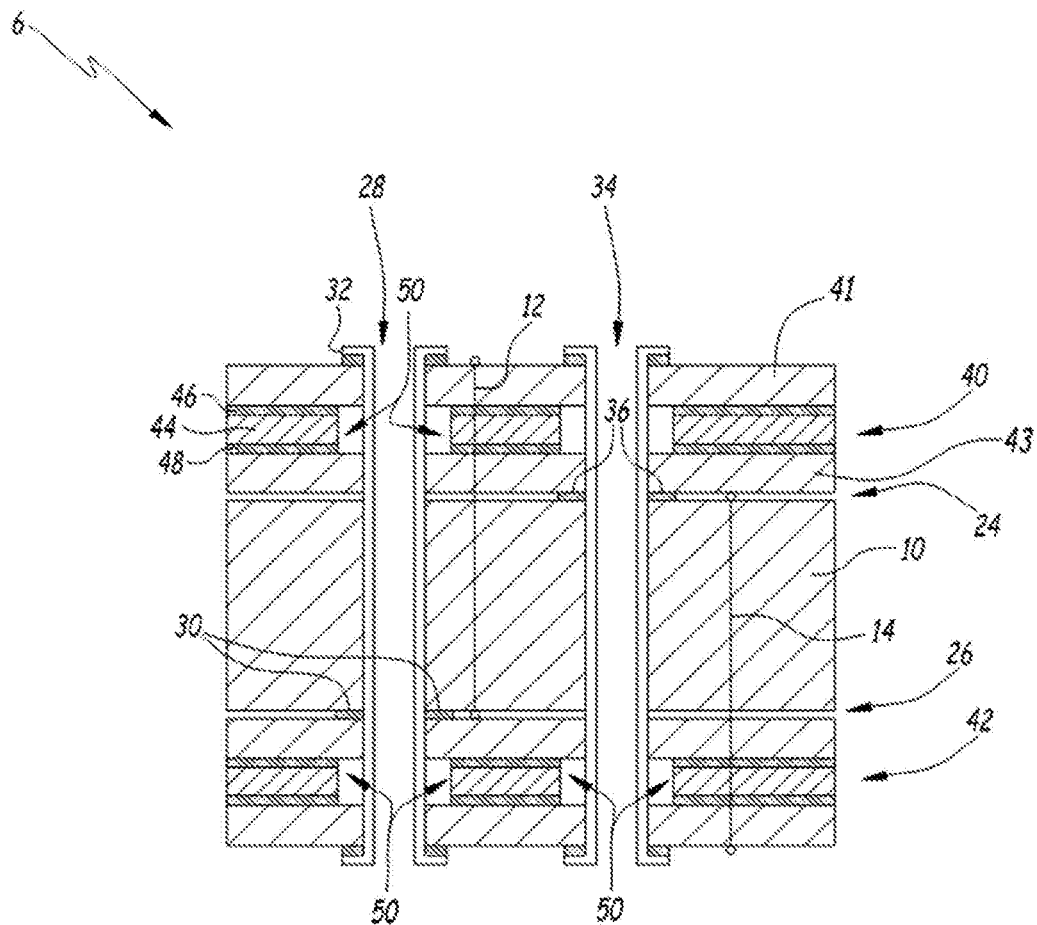
FIG. 3 is a schematic representation in cross section of the current sensor of FIG. 2.

A first embodiment of the current sensor 6 is shown in FIGS. 2 and 3.

The current sensor 6 includes a substrate 10, which is preferably planar in shape.

FIG. 2 shows the current sensor 6 as an elevation in a geometric plane parallel to the substrate 10, thus showing the appearance of the sensor 6 on the upper face of the substrate 10. However, the substrate 10 itself is not illustrated in order to facilitate the understanding of the figure. In FIG. 3, part of the current sensor 6 is shown in a sectional plane perpendicular to the plane of the substrate 10.

Preferably, the substrate 10 is electrically insulating.

According to some examples, the substrate 10 is a printed circuit board including one layer or a plurality of stacked layers of a cured polymer material, such as an FR-4 epoxy resin.

The substrate 10 may, for example, be manufactured by laminating a plurality of layers of fibrous weaves pre-impregnated with resin, by depositing material, by means of additive manufacturing, or by means of any other suitable method.

According to some embodiments, the winding includes at least one coil 12 wound around a portion of the substrate 10.

For example, an electrical conductor is wound in turns around one layer or a plurality of layers of the substrate 10.

According to some examples, the coil 12 passes at least partly through the substrate 10, for example by means of metallized holes (also referred to as "vias") pierced into the substrate 10 and entering the substrate 10 through at least part of its thickness and in a direction perpendicular to the plane of the substrate 10. The coil 12 also includes electrically conductive tracks, for example made of metal, such as copper, which extend over one or more of the layers of the substrate 10, for example in a direction parallel to the plane of the substrate 10.

In other words, the coil 12 is formed through the association of metallized holes which run perpendicular to the plane of the substrate 10 and electrically conductive tracks which extend over layers of the substrate 10.

Generally speaking, the term "coil" does not imply a particular shape for a turn, which may be a circular, ovoidal, polygonal or take any other shape. In the embodiment described by way of example, the turns are polygonal in shape, for example rectangular or square in shape.

Preferably, part of the coil 12 emerges onto an outer face of the substrate 10, as will be described in greater detail below.

According to one or more embodiments, the coil 12 includes a plurality of coil portions 16, 18, 20, 22 that are electrically connected in series.

In the example illustrated, the coil portions 16, 18, 20, 22, also referred to as coil segments, are rectilinear in shape and are arranged so as to form a closed contour in the shape of a quadrilateral around the central opening. For example, the closed contour is centred on the central opening.

For example, four coil portions 16, 18, 20, 22 are arranged end-to-end at right angles around the central opening, parallel to the plane of the substrate, while being connected only by one portion of the wire forming the winding.

In the embodiments illustrated, the winding advantageously includes the association of two coils: a second coil 14 is electrically connected in series with the one first coil 12.

It is however specified that, according to some alternative embodiments, the winding may include only one coil. Thus, one or the other of the coils 12 and 14 may be omitted.

According to yet other variants, other additional coils may be associated in an analogous manner to form the winding.

In the example illustrated, the coils 12 and 14 are wound around different portions of the substrate 10 and are interlaced with one another.

For example, the term "interlaced" is understood to mean that, over at least part of the length of the closed contour, the respective turns of the coils 12 and 14 are arranged in alternation.

Preferably, said portions of the substrate 10 are offset in a direction perpendicular to the plane of the substrate 10.

In the example shown in FIG. 3, the turns of the first coil 12 surround a first portion of the substrate 10 formed between the upper face of the substrate 10 and an interface 26 between sublayers of the substrate, by virtue of holes or openings, such as blind vias or through-vias, running down into the substrate 10 perpendicular to the plane of the substrate 10. The coil 12 emerges onto an upper face of the substrate 10.

For example, the interface 26 lies in a geometric plane parallel to the plane of the substrate 10. In FIG. 3, the interface 26 is shown with exaggerated spacing in order to facilitate the understanding of the drawing. However, in practice, the sublayers of the substrate make direct contact at these interfaces.

In an analogous manner, the turns of the second coil 14 surround a second portion of the substrate 10 formed between the lower face of the substrate 10 and an interface 24 between the sublayers similar to the interface 26, by passing through holes that run between the interface 24 and the lower face of the substrate 10.

In this example, the interface 24 is located above the interface 26. The coil 14 emerges onto a lower face of the substrate 10.

According to some embodiments, the additional coil 14 includes coil parts that are similar to the coil portions 16, 18, 20, 22 of the coil 12.

Preferably, the portions of the coil 14 are aligned or superposed with the corresponding coil portions 16, 18, 20, 22 of the coil 12, in a direction perpendicular to the plane of the substrate 10, as illustrated in FIG. 2.

According to some optional embodiments, through-vias 28 may be formed in the substrate 10, for example by piercing the substrate 10 through the entire thickness thereof in a direction perpendicular to the plane of the substrate 10.

Optionally, metal pads 30, 36 are deposited on the through-vias at the upper and lower faces of the coils when said through-via is in the vicinity of a coil. For example, the pads are arranged at the interfaces 24 or 26.

Preferably, the metal pads are made of copper. According to one manufacturing method given by way of example, the metal pads 30, 36 are manufactured before the assembly of the substrate 10 by depositing a metal layer on a base stack of the substrate. Next, this metal layer is etched with a predetermined pattern in order to form the pads 30 and 36, and then it is covered with other layers of the substrate 10. When the substrate 10 is subsequently pressed by rolling in order to finish the manufacturing of the sensor 6, the layers come into contact at the interfaces 24 and 26, respectively, and fill the void left by the metal removed by the etch.

In the example illustrated, the through-via 28 is arranged in the vicinity of the coil 12. Metal pads 30 are arranged in the interface 26, where the inner face of the coil 12 is arranged.

For example, the metal pads are circular or square in shape and are arranged around the section of the through-via 28 in this interface 26.

Preferably, metal pads 32 are arranged at the upper and lower ends of the through-via 28 on the upper and lower faces, respectively, of the substrate 10.

In the example illustrated, a second through-via 34, similar to the through-via 28, is arranged in the vicinity of the second coil 14. Metal pads 36 which are analogous to the metal pads 30 are arranged in the interface 24.

These examples are not limiting and other through-vias may be configured differently. As a variant, the through-vias 28, 34 may be omitted.

According to some particularly advantageous embodiments, the current sensor 6 includes at least one ferromagnetic layer 40, 42 incorporated within the or each insulating substrate 10 portion which is surrounded by the or each coil, such that said coil surrounds said ferromagnetic layer.

In the example illustrated, a first ferromagnetic layer 40 is incorporated within the first substrate 10 portion which is surrounded by the first coil 12, between the upper face of the substrate 10 and the interface 24.

A second ferromagnetic layer 42 is incorporated within the second substrate 10 portion which is surrounded by the second coil 14, between the lower face of the substrate 10 and the interface 26.

By virtue of the addition of such a ferromagnetic layer, the gain of the current sensor 6 is improved. Ultimately, this allows the accuracy of the current measurement by the measurement sensor 6 and by the measurement system 2 to be improved.

In one non-limiting example given by way of illustration, the inventors have observed that, by virtue of the embodiments of the invention, the measurement gain of the current sensor 6 may be improved fivefold or more in comparison with the known printed circuit board Rogowski windings, for example to obtain a gain of greater than or equal to 80 μV per ampere.

This increase in gain is particularly advantageous when the sensor 6 is used as a current sensor in an electrical protection device within an electricity distribution installation. Specifically, an electrical protection device must be able to be tripped quickly as soon as an electrical fault is measured. However, some signal processing means, such as passive integrators, introduce an attenuation of the signal which, with current sensors exhibiting low gain, may negatively affect the signal to the extent of compromising the capability of the processing circuit 8 to detect the electrical fault.

The use of a digital integrator would allow the measured signal to be attenuated only slightly, but would have the drawback of introducing a substantial latency time to the extent that the protection device would not be able to react fast enough in the event of an electrical fault being detected. In contrast, by virtue of the sensor 6, the processing circuit 8 may include a simple passive integrator, which is much simpler to manufacture and allows the aforementioned problems to be avoided.

As a variant, the number of ferromagnetic layers may differ. It is for example chosen according to the number of coils 12 or 14. It is therefore understood that, in the variants in which the coil 14 is omitted, the layer 42 may also be omitted.

Preferably, each coil 12 or 14 surrounds only one ferromagnetic layer.

In practice, the first coil 12 crosses the first ferromagnetic layer 40. The second coil 14 crosses the second ferromagnetic layer 42. Preferably, the coils 12 and 14 do not make electrical contact with the ferromagnetic layers 40 and 42.

According to some examples, the ferromagnetic layers 40 and 42 are identical.

Preferably, the ferromagnetic layers 40 and 42 are similar or identical in terms of dimensions and geometric arrangements, for example aligned or superposed relative to one another in a direction perpendicular to the plane of the substrate 10.

In what follows, only the ferromagnetic layer 40 is described in detail, but this teaching is transposable to the ferromagnetic layer 42.

According to some embodiments, the ferromagnetic layer 40 includes a sublayer of an alloy of iron and of nickel 44 and two sublayers of copper 46, 48 stacked on either side of the sublayer 44.

For example, the iron and nickel alloy is an FeNi36 alloy, also known by the registered trade mark "Invar". This alloy advantageously makes it possible to obtain good magnetic properties while exhibiting mechanical properties which are beneficial to the construction and the strength of the substrate 10.

The ferromagnetic layer 40 may be formed by depositing material, or be constructed in the form of a plate that is incorporated within the substrate 10 during the manufacturing thereof.

As a variant, other materials may be used to form the ferromagnetic layer 40, such as a ferromagnetic metal alloy.

According to some embodiments, the ferromagnetic layer 40 is greater than or equal to 150 μm, or greater than or equal to 250 μm.

In the example illustrated, the ferromagnetic layer 40 is arranged between a first sublayer 41 of the substrate 10 and a second sublayer 43 of the substrate. The interface 24 is formed between the second sublayer 43 and a layer of the core of the substrate 10. A similar arrangement is used for the ferromagnetic layer 42 with respect to the interface 26.

In one non-limiting example given by way of illustration, the total thickness of the substrate 10, measured in a direction perpendicular to the plane of the substrate 10, may be between 0.1 cm and 1 cm.

According to some embodiments, when one or more through-vias 28, 34 pass through the substrate 10, the ferromagnetic layer 40 may be separated laterally from said through-via 28, 34 by a buffer zone 50 devoid of ferromagnetic material.

It is understood that this buffer zone 50 is arranged in line with the ferromagnetic layer 40.

According to some examples, the buffer zone 50 may be filled with an electrically insulating material, or be formed by a void in the ferromagnetic layer 40. In other words, the ferromagnetic layer 40 does not make electrical contact with the through-vias 28 and 34. The void may be obtained by piercing the ferromagnetic layer or by etching the ferromagnetic layer.

For example, the buffer zone 50 is sized so that the distance between the lateral edge of the through-via 28, 34 and the ferromagnetic material of the ferromagnetic layer 40 closest to said lateral edge, this distance being measured in a direction parallel to the plane of the substrate 10, is greater than or equal to 25% of the width of said through-via.

In one non-limiting example given by way of illustration, the width of the through-via 28 is equal to 650 μm. On each side of the through-via 28, the width of the buffer zone 50 is greater than or equal to 200 μm.

Figure 4:
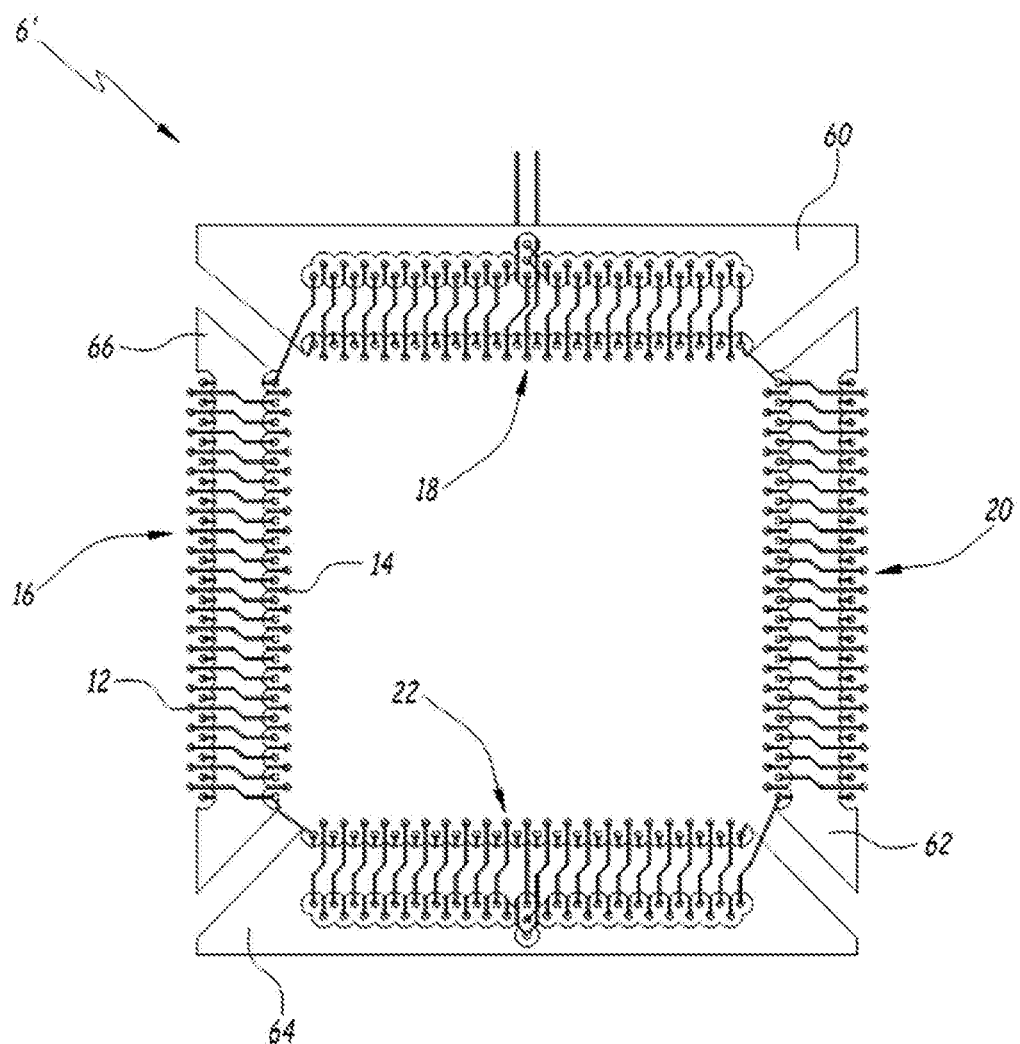
FIG. 4 is a schematic representation of a current sensor of a second embodiment of the invention.

FIG. 4 shows a current sensor 6' according to a second embodiment. The elements of current sensor 6' which are analogous to the first embodiment bear the same references and are not described in detail, in so far as the description provided above with reference to FIGS. 2 and 3 may be transposed thereto.

The current sensor 6' is substantially identical or similar to the current sensor 6, and includes in particular a plurality of coil portions 14, 18, 20 and 22.

The current sensor 6' differs in particular from the current sensor 6 in that each ferromagnetic layer 40, 42 is divided, in the plane of the ferromagnetic layer, into a plurality of parts which are preferably electrically insulated from one another, each of these parts being associated with one of the coil portions 14, 18, 20 and 22.

In the example illustrated, the plate 40 is divided into four parts 60, 62, 64 and 66 that are associated with the coil portions 18, 20, 22 and 16, respectively.

It is understood that the parts 60, 62, 64 and 66 are electrically insulated from one another, for example by being separated, in the plane of the ferromagnetic layer 40, by a layer devoid of magnetic material or by an electrically insulating material, for example like the buffer zones 50 described above.

The expression "associated with a coil portion" is understood in this case to mean that the corresponding coil portion surrounds said ferromagnetic layer part and that it is aligned with said ferromagnetic layer part in a direction perpendicular to the plane of the substrate 10.

In practice, each part of the ferromagnetic layer 40, 42 is associated with just one of the coil portions 16, 18, 20 and 22.

Dividing the ferromagnetic layer in this way advantageously makes it possible to avoid premature magnetic saturation of the ferromagnetic layer when the current flowing through the conductor 4 reaches high values. The advantages afforded by the presence of the ferromagnetic layer in terms of gain are however preserved.

In this case too, this embodiment is not limited by the number of coil portions 16, 18, 20 and 22 or by the number of ferromagnetic layer parts 40, 42.

Although not illustrated in detail, it is understood that the same applies for the layer 42, which is itself also divided in an analogous manner.

Advantageously, the magnetic layer parts 60, 62, 64 and 66 may be formed by depositing magnetic layers that are similar to the layers 40 and 42 during the manufacturing of the substrate and then by cutting through these layers by piercing the substrate by means of a piercing tool. For example, a plurality of holes are pierced perpendicular to the plane of the substrate in the corners of the layers in order to form air gaps which define the parts 60, 62, 64 and 66. This method makes it possible to cut simultaneously through both ferromagnetic layers of the stack in the same way and thus to obtain parts 60, 62, 64 and 66 of the same size for both ferromagnetic layers. In addition, the width of the air gap may easily be adjusted by selecting a coarser or finer piercing tool, thereby making it easily possible to adjust the gain value of the sensor.

The embodiments and variants envisaged above may be combined with one another to give rise to new embodiments.

The invention claimed is:

1. Current sensor, comprising:
   an insulating substrate provided with a central opening, the central opening being configured to receive an electrical conductor; and
   a winding surrounding the central opening and including a coil wound around a portion of the insulating substrate;
   wherein the current sensor includes at least one ferromagnetic layer incorporated within the portion of the insulating substrate, the coil surrounding the ferromagnetic layer, and
   wherein a thickness of the ferromagnetic layer is greater than or equal to 150 μm.

2. Current sensor according to claim 1, wherein the coil includes a plurality of coil portions that are electrically connected in series, the coil portions being rectilinear in shape and arranged so as to form a closed contour in a shape of a quadrilateral around the central opening.

3. Current sensor according to claim 2, wherein the ferromagnetic layer is common to all of the plurality of coil portions.

4. Current sensor according to claim 2, wherein the ferromagnetic layer is divided into several parts, each associated with one of the plurality of coil portions.

5. Current sensor according to claim 1, wherein the ferromagnetic layer includes a sublayer of an alloy of iron and of nickel and two sublayers of copper stacked on either side of the sublayer of iron and nickel alloy.

6. Current sensor according to claim 5, wherein the iron and nickel alloy is an FeNi36 alloy.

7. Current sensor according to claim 1, wherein a thickness of the ferromagnetic layer is greater than or equal to 250 μm.

8. Current sensor according to claim 1, wherein the winding further includes an additional coil wound around another portion of the substrate and offset in a direction perpendicular to a plane of the substrate, the two coils being interlaced and electrically connected in series, and wherein an additional ferromagnetic layer is incorporated within said other portion of the insulating substrate, the additional coil surrounding the additional ferromagnetic layer.

9. Current sensor according to claim 1, wherein the substrate includes a through-via perpendicular to a plane of the substrate, and in which the ferromagnetic layer is separated from said through-via by a buffer zone devoid of ferromagnetic material.

10. Current sensor according to claim 1, wherein the substrate is a printed circuit board including one or more stacked layers of a cured polymer material.

11. Measurement system comprising a current sensor according to claim 1 and an electronic processing circuit that is configured to process a signal measured by the current sensor.

12. Current sensor, comprising:
    an insulating substrate provided with a central opening, the central opening being configured to receive an electrical conductor; and
    a winding surrounding the central opening and including a coil wound around a portion of the insulating substrate;
    wherein the current sensor includes at least one ferromagnetic layer incorporated within the portion of the insulating substrate, the coil surrounding the ferromagnetic layer, and wherein the coil includes a plurality of coil portions that are electrically connected in series, the coil portions being rectilinear in shape and arranged so as to form a closed contour in a shape of a quadrilateral around the central opening.

13. Current sensor according to claim 12, wherein the ferromagnetic layer is common to all of the plurality of coil portions.

14. Current sensor according to claim 12, wherein the ferromagnetic layer is divided into several parts, each associated with one of the plurality of coil portions.

* * * * *